United States Patent [19]
Froehner

[11] Patent Number: 5,986,321
[45] Date of Patent: *Nov. 16, 1999

[54] DOUBLE DENSITY FUSE BANK FOR THE LASER BREAK-LINK PROGRAMMING OF AN INTEGRATED CIRCUIT

[75] Inventor: Karl-Heinz Froehner, Hopewell Junction, N.Y.

[73] Assignee: Siemens Aktiengesellschaft, Munich, Germany

[*] Notice: This patent is subject to a terminal disclaimer.

[21] Appl. No.: 09/053,922

[22] Filed: Apr. 2, 1998

Related U.S. Application Data

[62] Division of application No. 08/780,242, Jan. 8, 1997, Pat. No. 5,773,869, which is a continuation of application No. 08/365,641, Dec. 29, 1994, abandoned.

[51] Int. Cl.$^6$ ................................................. H01L 29/74
[52] U.S. Cl. ........................ 257/529; 257/208; 257/209; 257/528; 365/96; 365/225.7
[58] Field of Search ................................. 257/208, 209, 257/528, 529; 365/96, 225.7

[56] References Cited

U.S. PATENT DOCUMENTS

| | | | |
|---|---|---|---|
| 4,491,860 | 1/1985 | Lim | 357/68 |
| 4,910,418 | 3/1990 | Graham et al. | 307/465 |
| 4,935,801 | 6/1990 | McClure et al. | 357/51 |
| 5,025,300 | 6/1991 | Billig et al. | 357/51 |
| 5,185,291 | 2/1993 | Fischer et al. | 437/173 |
| 5,244,836 | 9/1993 | Lim | 437/192 |
| 5,252,844 | 10/1993 | Takagi | 257/296 |
| 5,260,597 | 11/1993 | Orbach et al. | 257/529 |
| 5,281,868 | 1/1994 | Morgan | 307/441 |
| 5,285,099 | 2/1994 | Carruthers et al. | 257/529 |
| 5,321,322 | 6/1994 | Verheyen et al. | 307/465.1 |
| 5,773,869 | 6/1998 | Froehner | 257/529 |

*Primary Examiner*—Valencia Martin-Wallace
*Attorney, Agent, or Firm*—Robert A. Whitman

[57] ABSTRACT

A fuse bank for use in the laser break-link programming of an integrated circuit device. The fuse bank uses fuse elements with two ends that contain fusible regions proximate the first end and non-fusible regions proximate the second end. The fuse elements are aligned in alternately oriented parallel rows so that the first end of each fuse element is juxtaposed with the second end of any adjacent fuse element. By sequentially alternating the orientation of the fuse elements in the fuse bank, the fuse elements can be formed in a highly dense matter without bringing any two fusible regions too close to one another. Accordingly, a laser can be used to sever selected fusible regions without adversely effecting other fusible regions within the fuse bank. By alternating the orientations of sequential fuse elements, a fuse bank can be created that is twice as dense as single orientation fuse banks with only a 30% to 50% increase in size. The space savings on an integrated circuit enables more circuitry per unit space and promotes the further miniaturization of the integrated circuit device.

7 Claims, 3 Drawing Sheets

DOUBLE DENSITY FUSE BANK FOR THE LASER BREAK-LINK PROGRAMMING OF AN INTEGRATED CIRCUIT

This is a divisional of application Ser. No. 08/780,242 filed Jan. 8, 1997, now U.S. Pat. No. 5,773,869 which is a continuation of application Ser. No. 08/365,641 filed Dec. 29, 1994, now abandoned.

FIELD OF THE INVENTION

The present invention relates to fuse banks used in conjunction with semiconductor integrated circuits to program the integrated circuit and selectively remove defective circuits in a circuit bank. More specifically, the present invention relates to the structure of a fuse bank, wherein the density of the fuse bank is increased to promote miniaturization.

BACKGROUND OF THE INVENTION

Semiconductor integrated circuits contain large numbers of electronic devices such as diodes and transistors built onto a single crystal or chip, often made of silicon. Since these devices are so small, their operational integrity is very susceptible to imperfections or impurities in the crystal. The failure of a single transistor in a circuit may render that circuit non-functional.

In order to circumvent this problem, the semiconductor industry regularly builds redundant circuits on the same chip. Therefore, if a faulty circuit is discovered during testing, the faulty circuit can be disabled and its redundant circuit enabled. Often, this switching to a redundant circuit is accomplished by blowing certain fuses built into the circuitry of the chip. Those fuses signal the location of the defective element and enable a substitute element in a redundant circuit bank.

In the case of memory ICs, memory cells are usually arranged in rows and columns. Each memory cell is addressed by a particular row and column. By blowing the correct combination of fuses, circuitry which addresses the faulty elements, can be isolated and replaced with circuitry which addressed a corresponding redundant element.

A common method of selectively blowing fuses in a fuse bank is by the use of a laser, wherein energy from the laser is selectively directed toward the various fuses. The laser melts the selected fuses and isolates the defective circuits. This process is commonly known as laser break-link programming or laser programming.

The process of laser break-link programming, however, does have its drawbacks. Primary among them is the required size of the fuse bank in order to effectively use a laser. As a laser is directed against surface of a chip, it generally burns a round crater onto whatever surface the laser strikes. When used to melt a fuse, the diameter of the crater made by the laser must be wider than the fuse to ensure that the fuse is completely severed. However, the crater caused by the laser can not be too wide or else the laser will melt fuses positioned next to the targeted fuse. Consequently, prior art fuse banks need to be manufactured with relatively large spaces between the various fuses in the fuse bank. Due to semiconductor circuit manufacturing tolerances and laser light tolerances, the typical fuse bank must have a spacing of at least 4.5 $\mu$M to 5.4 $\mu$M in order for laser break-link programming to be used. This required spacing often causes multiple fuse banks to be present at various places on a integrated circuit chip. This consumes a significant amount of space on the chip, limiting further miniaturizing of the integrated circuits.

The prior art is replete with different fuse bank structures that attempt to reduce the size of fuse banks. Such prior art references are exemplified by U.S. Pat. No. 5,185,291 to Fisher, entitled METHOD OF MAKING SEVERABLE CONDUCTIVE PATH IN AN INTEGRATED-CIRCUIT DEVICE; U.S. Pat. No. 4,910,418 to Graham et al. entitled SEMICONDUCTOR FUSE PROGRAMMABLE ARRAY STRUCTURE; U.S. Pat. No. 4,935,801 to McClure et al. entitled METALLIC FUSE WITH OPTICALLY ABSORPTIVE LAYER; and U.S. Pat. No. 5,025,300 to Billing et al, entitled INTEGRATED CIRCUITS HAVING IMPROVED FUSIBLE LINKS. Such prior art references provide structures that absorb laser radiation and increase the effectiveness of the laser. However, such prior art systems are still limited by the size of the laser, wherein the spacing between fusible links must be large enough to accommodate the diameter of the laser beam.

It is therefor an objective of the present invention to provide a fuse bank with an increased density of fusible links, wherein the distance between separate elements in the fuse bank is less than the diameter of the laser beam used to sever those elements.

It is a further objective of the present invention to increase the density of a fuse bank by 100% while increasing the size of the fuse bank by less than 50%.

SUMMARY OF THE INVENTION

The present invention is a fuse bank for use in the laser break-link programming of an integrated circuit device. The fuse bank uses fuse elements with two ends that contain fusible regions proximate the first end and non-fusible regions proximate the second end. The fuse elements are aligned in alternately oriented parallel rows so that the first end of each fuse element is juxtaposed with the second end of any adjacent fuse element. By sequentially alternating the orientation of the fuse elements in the fuse bank, the fuse elements can be formed in a highly dense matter without bringing any two fusible regions too close to one another. Accordingly, a laser can be used to sever selected fusible regions without adversely effecting other fusible regions within the fuse bank.

By alternating the orientations of sequential fuse elements, a fuse bank can be created that is twice as dense as single orientation fuse banks with only a 30% to 50% increase in size. The space savings on an integrated circuit enables more circuitry per unit space and promotes the further miniaturization of the integrated circuit device.

BRIEF DESCRIPTION OF THE DRAWINGS

The present invention will be more fully understood by referring to the following detailed description, the above background information and the claims appended hereto, when considered in connection with the accompanying drawings, wherein:

DETAILED DESCRIPTION OF THE DRAWINGS

Figure 1:
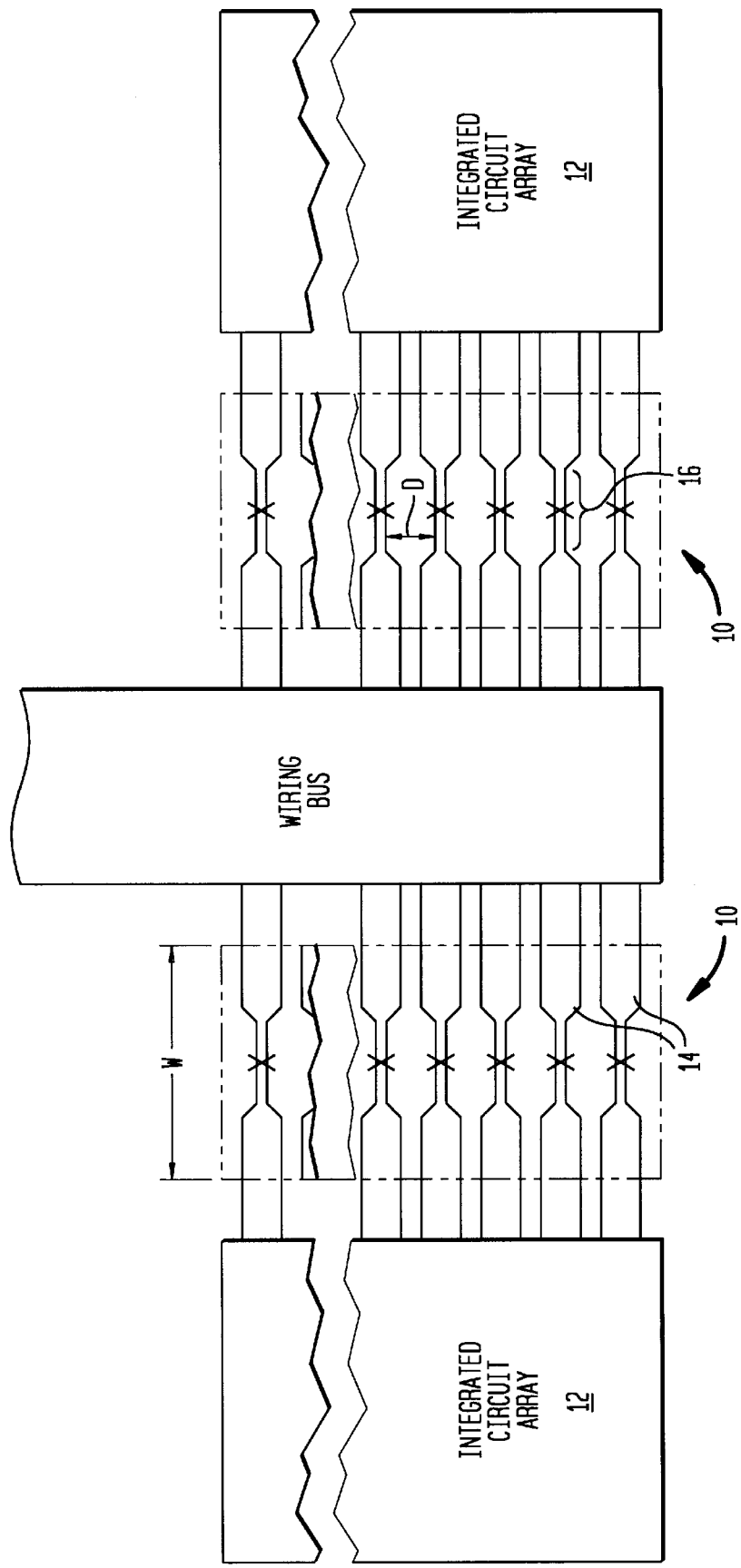
FIG. 1 shows two prior art fuse banks used in conjunction with two separate integrated circuit arrays.

Referring to FIG. 1, there is shown two prior art fuse banks 10 used to program two integrated circuit (IC) arrays 12. Each of the fuse banks 10 includes a plurality of fusible elements 14 made of polycrystalline silicon, tungsten silicide or a similar conductor. The fusible element 14 have reduced regions 16 which are linearly aligned. The X's superimposed over the reduced region 16 show the position where the center of the laser beam is aimed during laser break-link programming. Depending upon the manufacturing method used to make the fuse banks 10, the IC application and the laser used during laser break-link programming, the distance D in between the various fusible elements 14 is typically between 4.5 $\mu$M and 5.4 $\mu$M. As can be seen, in order to provide laser break-link programming to two adjacent IC arrays 12, room on the chip must be made for the two fuse banks 10 and the wiring leading to the two fuse banks 10. In a typical application, a single prior art fuse bank would have a width W of approximately ten microns.

Figure 2:
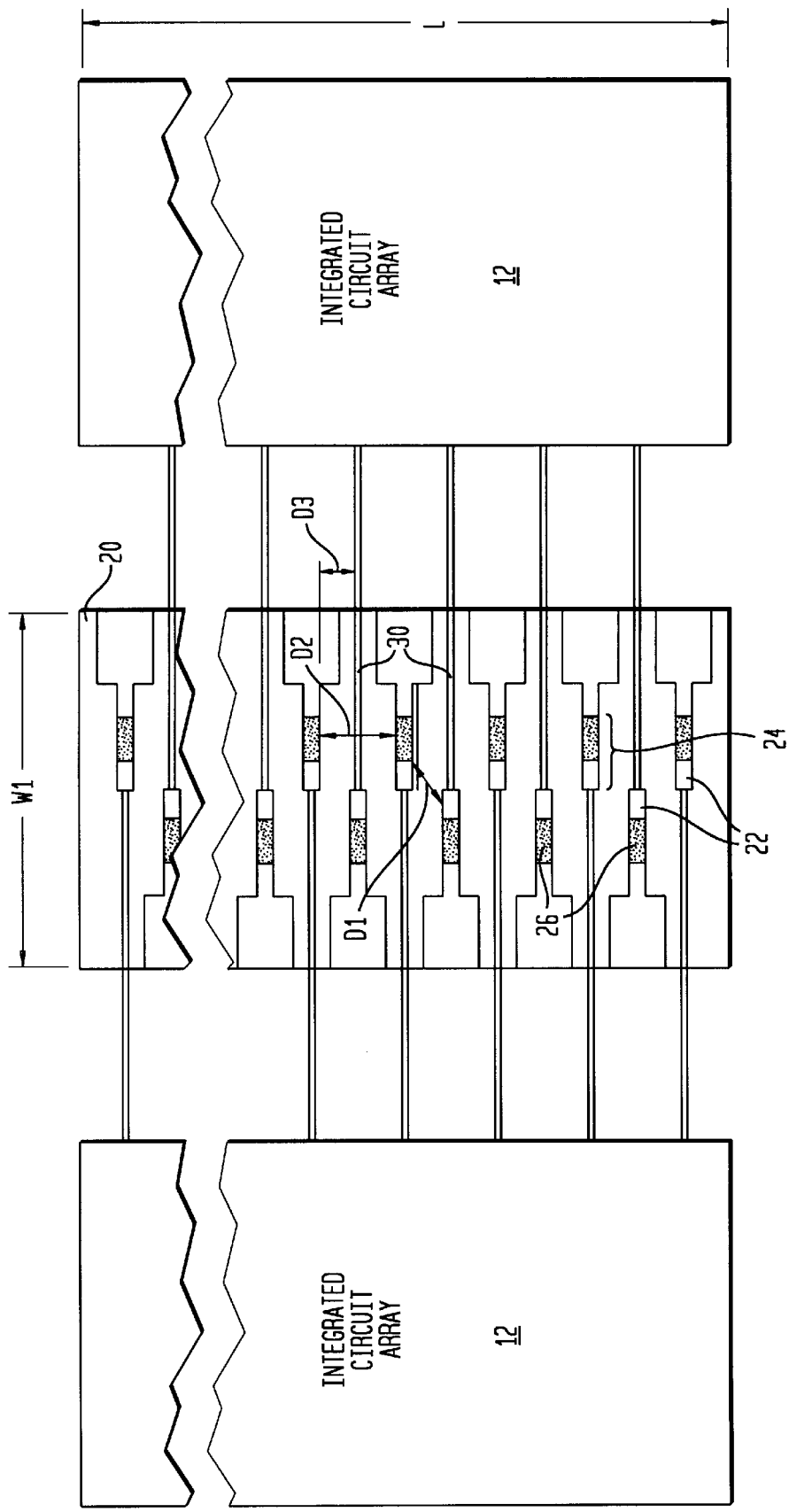
FIG. 2 shows a preferred embodiment of the present invention fuse bank in conjunction with two separate integrated circuit arrays.

Referring to FIG. 2, the present invention fuse bank 20 is shown in conjunction with two IC arrays 12. As can be seen, a single bank 20 supports the two IC arrays 12. In FIG. 2, the fuse bank 20 is comprised of a series of compound fuse elements 22. Each compound fuse element 22 has a reduced region 24 of readily fusible material such as that used in the prior art. Target areas 26 on the reduced region 24 may have an optically absorptive layer or other prior art structure that promotes the efficiency of a laser in severing the fuse element. The target areas 26 corresponds to the position of where the center of the laser beam is aimed during laser break-link programming.

Conductive elements 30 are coupled to the reduced region 24 of each of the fuse elements 22. The conductive elements 30 are made of any conductive material that is resistant to the laser radiation at the intensity needed to sever the target areas 26. In order to be resistant to the laser radiation, the conductive elements 30 may be much thicker than the target areas 26. Alternatively, the conductive elements 30 may be made of a reflective material such as gold, tungsten or another metal. Alternatively, the conductive elements 30 may be coated with a reflective material that does not absorb much of the laser's energy. Coatings and materials capable of resisting laser energy such as tungsten, gold and the like are known and used in the manufacture of semiconductor circuits.

In the present invention fuse bank 20, the various target areas 26 of the fuse elements 22 do not align in a single column. Rather, the orientation of fuse elements 22 is staggered wherein every other fuse element faces in a first direction and the interposed fuse elements face a second opposite direction. In this orientation only one fuse bank 20 is needed to support two IC arrays 12, wherein the IC arrays are disposed on either side of the fuse bank 20. The distance D1 between target areas 26 on each adjacent fuse elements 22 is now within the required 4.5 $\mu$M to 5.4 $\mu$M range, as is the distance D2 between the target areas 26 of every alternating fuse element. Since the various fuse elements 22 are stacked twice as dense as in the prior art, the actual distance or pitch D3 in between adjacent fuse elements 22 is between, 2.2 $\mu$M and 2.7 $\mu$M, half of that available in the prior art.

By alternating the orientation of every other fuse element 22 in the fuse bank 20, the target areas 26 align is two distinct rows. This configuration adds approximately 30% to 50% more width W1 to the fuse bank 20 as compared to prior art fuse banks. However, the present invention fuse bank 20 has twice as many fuses per unit length L than is available in the prior art. Consequently, a 100% increase in fuse density can be had for a 30% to 50% increase in size. Further size reductions are also provided by the elimination of the lead wiring needed to join two separate fuse banks in the prior art.

Figure 3:
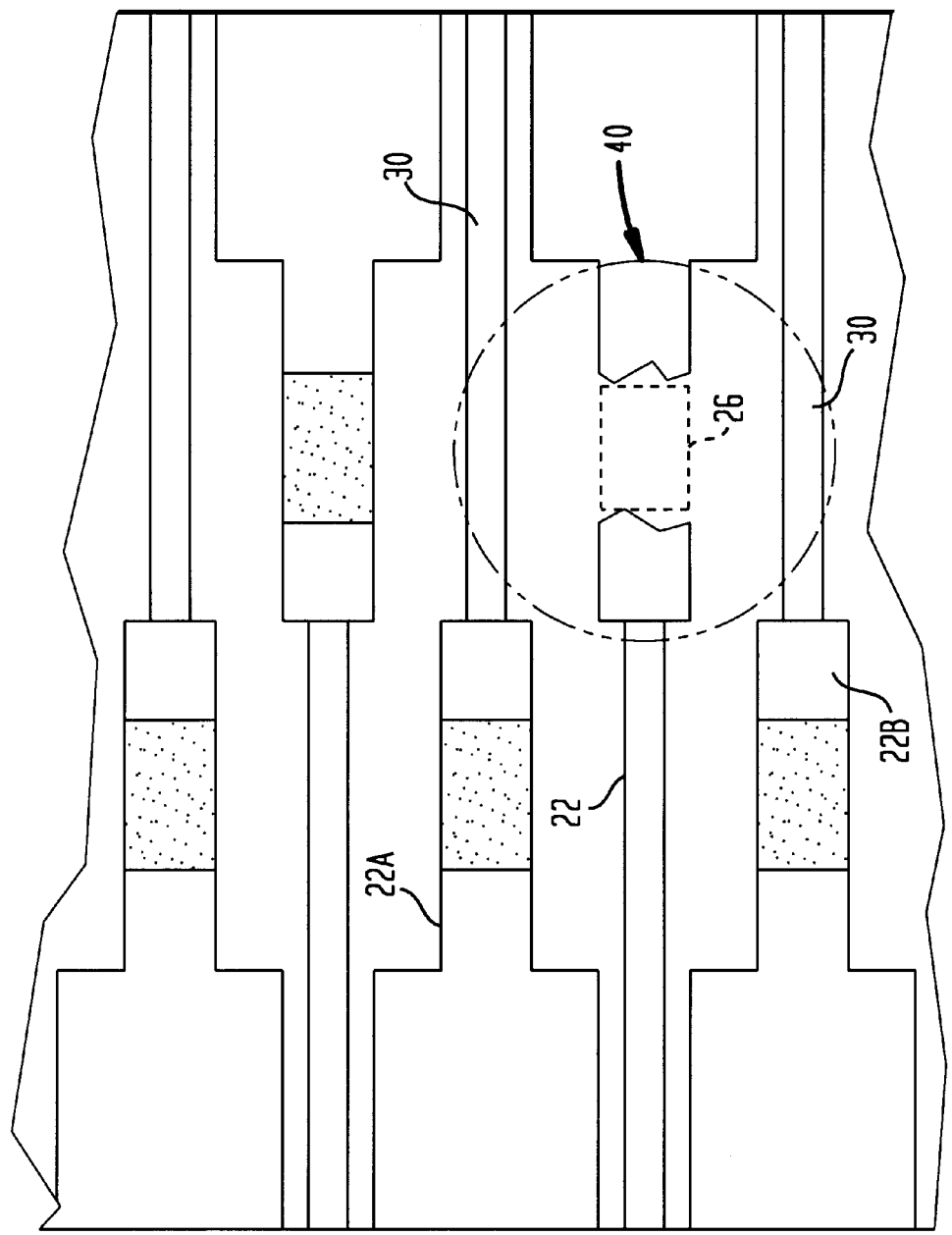
FIG. 3 shows an enlarged segment of FIG. 2 displaying the interaction between a laser beam and the present invention.

Referring to FIG. 3, it can be seen that during laser break-link programming, laser light, represented by circle 40, is directed toward the target area 26 of one of the fuse elements 22. The laser light 40 partially overlaps the conductive elements 30 of the two adjacent fuse elements 22a, 22b. However, since the target area 26 of the center fuse element 22 is made of a material that absorbs laser radiation, the laser easily severs the target area 26. The two conductive elements 30, however, are reflective to laser radiation and remain intact while the target area 26 is severed. The staggered configuration thereby prevents any two target areas from being exposed to the same pulse of laser light. This enables the fuse bank 20 to be manufactured in a much denser manner than previously available.

The present invention, as previously described, can be used to make fuse banks more dense. However, by keeping the same density (fusible elements per unit length), the present invention can be used to increase the space in between the fusible elements within the fuse bank. With more space available in between fusible elements, a wet etch process can be used to sever the fusible elements instead of a laser. Wet etch processes typically are less complex and less costly than laser break-link processes, thereby providing a cost and labor savings during manufacture.

It will be understood that the specific embodiments of the present invention described herein are merely exemplary and are present to express the best mode of the invention. However, a person skilled in the art may make many variations and modifications to the described embodiments by using functionally equivalent components and processes. All such variations, modifications and alternate embodiments are intended to be considered within the scope of the invention as stated in the following claims.

What is claimed is:

1. A fuse bank for use in the laser programming of an integrated circuit, comprising:
    a plurality of fusible elements each having a first end and a second end wherein each fusible element includes a fusible region, proximate said first end, configured to be severed by a predetermined exposure of laser radiation and, a non-fusible region, proximate said second end, configured to be unsevered by said predetermined exposure to laser radiation;
    wherein said fusible elements are alternately aligned in substantially parallel, rows so that the first end of a first one of the fusible elements in one of the rows, is juxtaposed with, and disposed between, the second ends of a pair of the fusible elements disposed in adjacent ones of the rows of fusible elements.

2. The fuse bank according to claim 1, wherein the parallel rows of fusible elements are disposed between 2.2 $\mu$M and 2.7 $\mu$M apart.

3. The fuse bank according to claim 1, wherein said fusible region includes a target area adapted to absorb laser radiation.

4. The fuse bank according to claim 1, wherein each said fusible region is separated by a distance of at least 4.5 $\mu$M.

5. The fuse bank according to claim 1, wherein said nonfusible region includes a metal that is substantially reflective to said predetermined exposure of laser radiation.

6. The fuse bank recited in claim 1 wherein the first end of such first one of the fusible elements is laterally offset from the first ends of said pair of fusible elements.

7. The fuse bank recited in claim 1 wherein the first ends are staggered from row to row.

* * * * *